United States Patent
Prakash

(10) Patent No.: US 8,846,441 B2
(45) Date of Patent: Sep. 30, 2014

(54) ANODE FOR AN ORGANIC ELECTRONIC DEVICE

(75) Inventor: Shiva Prakash, Santa Barbara, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 115 days.

(21) Appl. No.: 13/478,592

(22) Filed: May 23, 2012

(65) Prior Publication Data

US 2012/0231577 A1  Sep. 13, 2012

Related U.S. Application Data

(62) Division of application No. 12/467,567, filed on May 18, 2009, now Pat. No. 8,242,487.

(60) Provisional application No. 61/053,960, filed on May 16, 2008.

(51) Int. Cl.
*H01L 51/00* (2006.01)
*H01L 51/52* (2006.01)

(52) U.S. Cl.
CPC ........ *H01L 51/0021* (2013.01); *H01L 51/5206* (2013.01); *H01L 2251/308* (2013.01)
USPC .............. 438/99; 257/22; 257/688; 257/690; 257/E51.005

(58) Field of Classification Search
USPC .................. 257/40, 642–643, 759, 257/E51.001–E51.052, E25.008–E25.009
See application file for complete search history.

(56) References Cited

U.S. PATENT DOCUMENTS

| | | | |
|---|---|---|---|
| 4,539,507 | A | 9/1985 | VanSlyke et al. |
| 5,294,870 | A | 3/1994 | Tang et al. |
| 5,853,905 | A | 12/1998 | So et al. |
| 5,981,092 | A | 11/1999 | Arai et al. |
| 6,280,861 | B1 | 8/2001 | Hosokawa et al. |
| 6,312,837 | B1 | 11/2001 | Kijima |
| 6,416,888 | B1 | 7/2002 | Kawamura et al. |
| 6,670,645 | B2 | 12/2003 | Grushin et al. |
| 6,712,661 | B1 | 3/2004 | Kiguchi et al. |
| 6,828,045 | B1 | 12/2004 | Tokailin et al. |
| 6,953,705 | B2 | 10/2005 | Prakash |
| 6,963,383 | B2 | 11/2005 | Tokailin et al. |
| 7,023,013 | B2 | 4/2006 | Ricks et al. |
| 7,235,420 | B2 | 6/2007 | Prakash et al. |
| 7,270,586 | B2 | 9/2007 | Tokailin et al. |
| 2002/0117962 | A1* | 8/2002 | Beierlein et al. .............. 313/504 |
| 2003/0107042 | A1* | 6/2003 | Chang et al. .................... 257/79 |

(Continued)

FOREIGN PATENT DOCUMENTS

| | | |
|---|---|---|
| JP | 07235219 A | 9/1995 |
| JP | 09063771 A | 3/1997 |

(Continued)

OTHER PUBLICATIONS

Wang, "Photoconductive Materials," Kirk-Othmer Encyclopedia of Chemical Technology, Fourth Edition, 1996, vol. 18, pp. 837-860.

(Continued)

*Primary Examiner* — Mamadou Diallo

(57) ABSTRACT

There is provided an anode for an organic electronic device. The anode is a conducting inorganic material having an oxidized surface layer. The surface layer is non-conductive and hole-transporting.

4 Claims, 1 Drawing Sheet

(56) References Cited

U.S. PATENT DOCUMENTS

| | | | |
|---|---|---|---|
| 2004/0102577 A1 | 5/2004 | Hsu et al. | |
| 2004/0127637 A1 | 7/2004 | Hsu et al. | |
| 2005/0005850 A1* | 1/2005 | Yamazaki | 118/719 |
| 2005/0023961 A1 | 2/2005 | Pichler et al. | |
| 2005/0205860 A1 | 9/2005 | Hsu et al. | |
| 2006/0033421 A1 | 2/2006 | Matsuura et al. | |
| 2006/0049410 A1 | 3/2006 | Hosokawa et al. | |
| 2006/0049754 A1* | 3/2006 | Kwok et al. | 313/506 |
| 2006/0189076 A1* | 8/2006 | Nakajima | 438/257 |
| 2006/0192473 A1* | 8/2006 | Kojima et al. | 313/483 |
| 2006/0221643 A1* | 10/2006 | Park et al. | 362/632 |
| 2006/0234430 A1 | 10/2006 | Liu et al. | |
| 2006/0275926 A1 | 12/2006 | Carcia et al. | |
| 2007/0111026 A1* | 5/2007 | Deaton et al. | 428/690 |
| 2007/0170843 A1 | 7/2007 | Kawamura et al. | |
| 2008/0071049 A1 | 3/2008 | Radu et al. | |
| 2008/0157654 A1 | 7/2008 | Cok | |
| 2008/0193670 A1* | 8/2008 | Matsunami et al. | 427/532 |
| 2008/0268136 A1* | 10/2008 | Tokunaga et al. | 427/66 |
| 2008/0277657 A1 | 11/2008 | Jeong et al. | |
| 2009/0153030 A1* | 6/2009 | Huo et al. | 313/504 |
| 2009/0284136 A1* | 11/2009 | Kawamura | 313/504 |
| 2009/0309487 A1* | 12/2009 | Royster et al. | 313/504 |
| 2010/0084638 A1* | 4/2010 | Hotta et al. | 257/40 |
| 2010/0117063 A9* | 5/2010 | Kang et al. | 257/40 |

FOREIGN PATENT DOCUMENTS

| | | | |
|---|---|---|---|
| JP | 09204985 A | 8/1997 |
| JP | 09260062 A | 10/1997 |
| JP | 09260063 A | 10/1997 |
| JP | 09324176 A | 12/1997 |
| JP | 10214683 A | 8/1998 |
| JP | 11126689 A | 5/1999 |
| JP | 11307261 A | 11/1999 |
| JP | 2002170431 A | 6/2002 |
| JP | 2002170666 A | 6/2002 |
| JP | 2004139798 A | 5/2004 |
| JP | 2004311418 A | 11/2004 |
| JP | 2005259550 A | 9/2005 |
| JP | 2007059476 A | 3/2007 |
| JP | 2007201327 A | 8/2007 |
| KR | 1020010042727 A | 5/2001 |
| KR | 1020060135801 A | 12/2006 |
| WO | 03008424 A1 | 1/2003 |
| WO | 03040257 A1 | 5/2003 |
| WO | 03063555 A1 | 7/2003 |
| WO | 03091688 A2 | 11/2003 |
| WO | 2004016710 A1 | 2/2004 |
| WO | 2004054326 A2 | 6/2004 |

OTHER PUBLICATIONS

Extended European Search Report for Application No. EP 09830954.5, counterpart to U.S. Appl. No. 13/127,250; Jun. 1, 2012.

International Search Report for Application No. PCT/US2009/066202; Kim Ju Seung, Authorized Officer; KIPO; Jul. 5, 2010.

* cited by examiner

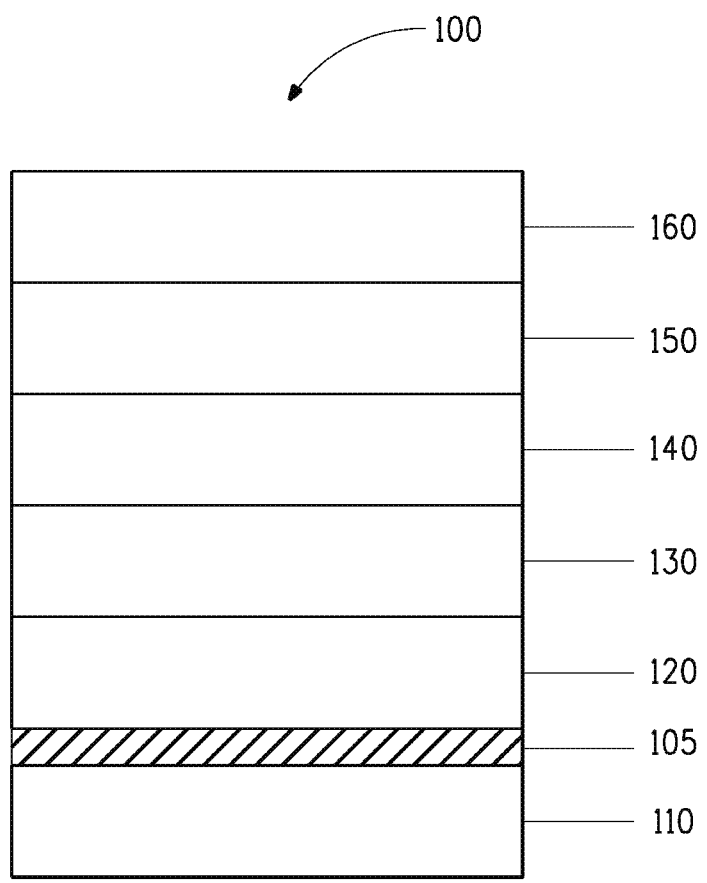

ANODE FOR AN ORGANIC ELECTRONIC DEVICE

RELATED APPLICATION

This application claims priority under 35 U.S.C. §120 from U.S. Ser. No. 12/467,567, filed on May 18, 2009 now U.S. Pat. No. 8,242,487, which in turn claims priority under 35 U.S.C. §119(e) from U.S. Provisional Application No. 61/053,960 filed on May 16, 2008 which is incorporated by reference in its entirety.

BACKGROUND INFORMATION

1. Field of the Disclosure

This disclosure relates in general to an anode for an electronic device and for the process for forming it.

2. Description of the Related Art

Electronic devices define a category of products that include an active layer. Organic electronic devices have at least one organic active layer. Such devices convert electrical energy into radiation such as light emitting diodes, detect signals through electronic processes, convert radiation into electrical energy, such as photovoltaic cells, or include one or more organic semiconductor layers.

Organic light-emitting diodes ("OLEDs") are an organic electronic device comprising an organic layer capable of electroluminescence. OLEDs containing conducting polymers can have the following configuration:

anode/EL material/cathode with optionally additional layers between the electrodes.

A variety of deposition techniques can be used in forming layers used in OLEDs, including vapor deposition and liquid deposition. Liquid deposition techniques include printing techniques such as ink-jet printing and continuous nozzle printing.

As the devices become more complex and with greater resolution, there is a continuing need for improved materials and processes for these devices.

SUMMARY

There is provided an anode for an organic electronic device comprising a conducting inorganic material having an oxidized surface layer which is non-conductive and hole-transporting.

There is further provided an organic electronic device comprising:
  a substrate,
  an anode comprising a conducting inorganic material having an oxidized surface layer which is non-conductive and hole-transporting
  at least one organic active layer, and
  a cathode.

There is further provided a process for forming an organic electronic device, comprising:
  providing a TFT substrate having an inorganic surface layer;
  forming a patterned anode on the TFT surface;
  treating the anode with an oxygen plasma with a sufficient power density and for a sufficient time to form a non-conductive, hole-transport surface layer on the anode;
  forming at least one organic active layer by a liquid deposition technique;
  applying a cathode.

The foregoing general description and the following detailed description are exemplary and explanatory only and are not restrictive of the invention, as defined in the appended claims.

BRIEF DESCRIPTION OF THE DRAWING

Embodiments are illustrated in the accompanying figure to improve understanding of concepts as presented in this disclosure.

FIG. 1 is one embodiment of an organic electronic device of the disclosed invention.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Anode, the Process, the Organic Electronic Device, and finally Examples.

1. Definitions and Clarification of Terms

Before addressing details of embodiments described below, some terms are defined or clarified.

The term "active material" refers to a material which electronically facilitates the operation of the device. Examples of active materials include, but are not limited to, materials which conduct, inject, transport, or block a charge, where the charge can be either an electron or a hole. Examples of inactive materials include, but are not limited to, planarization materials, insulating materials, and environmental barrier materials.

The term "anode" is intended to mean an electrode that is particularly efficient for injecting positive charge carriers. In some embodiments, the anode has a work function of greater than 4.7 eV.

The term "hole-transporting" refers to a layer, material, member, or structure that facilitates migration of positive charge through the thickness of such layer, material, member, or structure with relative efficiency and small loss of charge.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer.

The term "non-conductive," when referring to a material, is intended to mean a material that allows no significant current to flow through the material. In one embodiment, a non-conductive material has a bulk resistivity of greater than approximately $10^6$ ohm-cm. In some embodiments, the bulk resistivity is great than approximately $10^8$ ohm-cm.

The term "plasma" is intended to mean a collection of charged particles that respond strongly and collectively to electromagnetic fields, taking the form of gas-like clouds or ion beams. Since the particles in plasma are electrically charged (generally by being stripped of electrons), it is frequently described as an "ionized gas."

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited in case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Anode

One of the major issues facing OLED displays is the uniformity of the organic layers within the pixel. In some embodiments, the pixel edge is banked, using an organic photoresist or a ceramic material. The banks are present overlapping the edges of the transparent anode. This results in pixels that have increase in organic thickness going from the center to the edge, and pixels with a lower aperture ratio due to a lower fill factor. In some embodiments, the pixel edges are left uncovered, for example, by spacing the bank some distance away. This results is a decreased layer thickness at the very edge. Furthermore, uncovered anode edges would have severe current shunting. If current shunting could be prevented in the unbanked case, the display would benefit greatly from both a high fill factor as well as layer uniformity.

In addition, the surface of most conductive anode materials can have nonuniformities, including spikes of material. These can act as field concentrators and be a source of leakage currents. In extreme cases, shorting defects may result. Thus, it would be beneficial if the spikes could be prevented from causing leakage current.

The new anode described herein comprises a conductive material, the exposed parts of which have been treated to form an oxidized layer which is non-conductive and hole-transporting. Thus, the edges of the anode are highly resistive and current shunting is prevented. In addition, the spikes are oxidized and no long act as undesirable conducting hot spots.

Any conventional transparent conducting material may be used for the anode so long as the surface can be plasma oxidized. As used herein, the term "surface" as it applies to the anode, is intended to mean the exterior boundaries of the anode material which are exposed and not directly covered by the substrate. The anode layer may be formed in a patterned array of structures having plan view shapes, such as squares, rectangles, circles, triangles, ovals, and the like. Generally, the electrodes may be formed using conventional processes, such as selective deposition using a stencil mask, or blanket deposition and a conventional lithographic technique to remove portions to form the pattern.

In some embodiments, the electrodes are transparent. In some embodiments, the electrodes comprise a transparent conductive material such as indium-tin-oxide (ITO). Other transparent conductive materials include, for example, indium-zinc-oxide (IZO), Examples of suitable materials include, but are not limited to, indium-tin-oxide ("ITO"). indium-zinc-oxide ("IZO"), aluminum-tin-oxide ("ATO"), aluminum-zinc-oxide ("AZO"), and zirconium-tin-oxide ("ZTO"), zinc oxide, tin oxide, elemental metals, metal alloys, and combinations thereof. The thickness of the electrode is generally in the range of approximately 50 to 150 nm.

The surface of the anode is plasma-oxidized, as discussed below.

3. Process

The new anode has an oxidized surface such that the edges and any spikes are highly resistive. This involves applying an intense oxygen rich plasma oxidation step to the anode. This is not the same as the conventional low-power plasma or UVO cleaning step which normally takes place. Such plasma cleaning steps have been disclosed as useful for removing organic materials on contact pads, etc., in U.S. Pat. Nos. 6,953,705 and 7,235,420. For the new anode described herein, the anode is treated with an oxygen plasma with a sufficient power density and for a sufficient time to form an oxidized surface layer. This oxidized layer is highly resistive.

Plasma and plasma generators are well known. In general, a material is placed in a vacuum chamber and held at a specific pressure in the presence of the desired gas, and an electric field is applied. The plasma reactions are controlled by controlling the gas mixtures, gas pressures, voltage, power density, temperature and time.

For plasma oxidation of the anode, at least one oxygen-containing gas must be present. Exemplary oxygen-containing gases include $O_2$, $COF_2$, $CO$, $O_3$, $NO$, $N_2O$, and mixtures thereof. An inert may also be used. The inert gas may include any one or more of a noble gas, $N_2$, and mixtures thereof. The ratio of oxygen-containing gas to inert gas can be in the range of 10:0 to 1:10. In some embodiments, the oxygen-containing gas is molecular oxygen and the inert gas is argon.

The gas pressure is maintained in the range of 1 to 1000 mTorr. In some embodiments, the gas pressure is 1 to 50 mTorr.

The voltage is in a range of approximately 5 to 1000 V, depending on whether the plasma used is a capacitive-coupled type or a downstream type. The power densities are given in power per unit area of substrate. The power density is in a range of approximately 0.20 to 20 W/cm$^2$. In some embodiments, the power density is in the range of 5 to 10 W/cm$^2$.

The temperature is in the range of 20-100° C. In some embodiments, the temperature is in the range of 50-80° C.

The time of plasma oxidation is dependent upon the power density. For lower power density plasmas, in the range of 0.20 to 1.0 W/cm$^2$, the treating time is at least 10 minutes. For plasmas having a power density in the range of 5-10 W/cm$^2$, times of 1-5 minutes can be used. For plasmas having a power density of greater than 10 W/cm$^2$, even shorter times can be used.

The anode oxidation will be more pronounced at the edges and at any spikes due to the field concentration in the discharge, and thus provide increased oxidation where it is required.

4. Organic Electronic Device

The term "organic electronic device" or sometimes just "electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In some embodiments, the organic electronic device comprises:
- a substrate,
- an anode comprising a conducting inorganic material having an oxidized surface layer which is non-conductive and hole-transporting
- at least one organic active layer, and
- a cathode.

The substrate is a base material that can be either rigid or flexible and may be include one or more layers of one or more materials, which can include, but are not limited to, glass, polymer, metal or ceramic materials or combinations thereof. In some embodiments, the substrate is glass.

In some embodiments, the substrate is a TFT substrate. TFT substrates are well known in the electronic art. The base support may be a conventional support as used in organic electronic device arts. The base support can be flexible or rigid, organic or inorganic. In some embodiments, the base support is transparent. In some embodiments, the base support is glass or a flexible organic film. The TFT array may be located over or within the support, as is known. The support can have a thickness in the range of about 12 to 2500 microns.

The term "thin-film transistor" or "TFT" is intended to mean a field-effect transistor in which at least a channel region of the field-effect transistor is not principally a portion of a base material of a substrate. In one embodiment, the channel region of a TFT includes a-Si, polycrystalline silicon, or a combination thereof. The term "field-effect transistor" is intended to mean a transistor, whose current carrying characteristics are affected by a voltage on a gate electrode. A field-effect transistor includes a junction field-effect transistor (JFET) or a metal-insulator-semiconductor field-effect transistor (MISFET), including a metal-oxide-semiconductor field-effect transistor (MOSFETs), a metal-nitride-oxide-semiconductor (MNOS) field-effect transistor, or the like. A field-effect transistor can be n-channel (n-type carriers flowing within the channel region) or p-channel (p-type carriers flowing within the channel region). A field-effect transistor may be an enhancement-mode transistor (channel region having a different conductivity type compared to the transistor's S/D regions) or depletion-mode transistor (the transistor's channel and S/D regions have the same conductivity type).

The TFT substrate also includes a surface insulating layer. Although this layer can be an organic planarization layer, any exposed organic material will be removed with the plasma treatment. It is preferred to have an inorganic passivation layer as the insulating layer. Any inorganic dielectric material can be used. In some embodiments, the inorganic material is a metal oxide or nitride. In some embodiments, the inorganic material is selected from the group consisting of silicon oxides, silicon nitrides, or combinations thereof. In some embodiments, the inorganic passivation layer has a thickness of 50 to 500 nm; in some embodiments, 300-400 nm.

The organic layer or layers include one or more of a buffer layer, a hole transport layer, a photoactive layer, an electron transport layer, and an electron injection layer. The layers are arranged in the order listed.

The term "organic buffer layer" or "organic buffer material" is intended to mean electrically conductive or semiconductive organic materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Organic buffer materials may be polymers, oligomers, or small molecules, and may be in the form of solutions, dispersions, suspensions, emulsions, colloidal mixtures, or other compositions.

The organic buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The organic buffer layer can comprise charge transfer compounds, and the like, such as copper phthalocyanine and the tetrathiafulvalene-tetracyano-quinodimethane system (TTF-TCNQ). In one embodiment, the organic buffer layer is made from a dispersion of a conducting polymer and a colloid-forming polymeric acid. Such materials have been described in, for example, published U.S. patent applications 2004-0102577, 2004-0127637, and 2005/205860. The organic buffer layer typically has a thickness in a range of approximately 20-200 nm.

Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. The hole transport layer typically has a thickness in a range of approximately 40-100 nm. Although light-emitting materials may also have some charge transport properties, the term "hole transport layer" is not intended to include a layer whose primary function is light emission.

"Photoactive" refers to a material that emits light when activated by an applied voltage (such as in a light emitting diode or chemical cell) or responds to radiant energy and generates a signal with or without an applied bias voltage (such as in a photodetector). Any organic electroluminescent ("EL") material can be used in the photoactive layer, and such materials are well known in the art. The materials include, but are not limited to, small molecule organic fluorescent compounds, fluorescent and phosphorescent metal complexes, conjugated polymers, and mixtures thereof. The photoactive material can be present alone, or in admixture with one or more host materials. Examples of fluorescent compounds include, but are not limited to, naphthalene, anthracene, chrysene, pyrene, tetracene, xanthene, perylene, coumarin, rhodamine, quinacridone, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Examples of conjugated polymers include, but are not limited to poly(phenylenevinylenes), polyfluorenes, poly(spirobifluorenes), polythiophenes, poly (p-phenylenes), copolymers thereof, and mixtures thereof. The photoactive layer typically has a thickness in a range of approximately 50-500 nm.

"Electron Transport" means when referring to a layer, material, member or structure, such a layer, material, member or structure that promotes or facilitates migration of negative charges through such a layer, material, member or structure into another layer, material, member or structure. Examples of electron transport materials which can be used in the optional electron transport layer 140, include metal chelated oxinoid compounds, such as tris(8-hydroxyquinolato)aluminum (AlQ), bis(2-methyl-8-quinolinolato)(p-phenylphenolato) aluminum (BAlq), tetrakis-(8-hydroxyquinolato) hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. The electron-transport layer typically has a thickness in a range of approximately 30-500 nm. Although light-emitting materials may also have some charge transport properties, the term "electron transport layer" is not intended to include a layer whose primary function is light emission.

As used herein, the term "electron injection" when referring to a layer, material, member, or structure, is intended to mean such layer, material, member, or structure facilitates injection and migration of negative charges through the thickness of such layer, material, member, or structure with relative efficiency and small loss of charge. The optional electron-transport layer may be inorganic and comprise BaO, LiF, or $Li_2O$. The electron injection layer typically has a thickness in a range of approximately 20-100 Å.

The cathode can be selected from Group 1 metals (e.g., Li, Cs), the Group 2 (alkaline earth) metals, the rare earth metals including the lanthanides and the actinides. The cathode a thickness in a range of approximately 300-1000 nm.

An encapsulating layer can be formed over the array and the peripheral and remote circuitry to form a substantially complete electrical device.

A process for forming an organic electronic device, comprises:
providing a TFT substrate having an inorganic surface layer;
forming a patterned anode on the TFT surface;
treating the anode with an oxygen plasma with a sufficient power density and for a sufficient time to form a non-conductive, hole-transport surface layer on the anode;
forming at least one organic active layer by a liquid deposition technique;
applying a cathode.

In liquid deposition, an organic active material is formed into a layer from a liquid composition. The term "liquid composition" is intended to mean a liquid medium in which a material is dissolved to form a solution, a liquid medium in which a material is dispersed to form a dispersion, or a liquid medium in which a material is suspended to form a suspension or an emulsion. The term "liquid medium" is intended to mean a liquid material, including a pure liquid, a combination of liquids, a solution, a dispersion, a suspension, and an emulsion. Liquid medium is used regardless whether one or more solvents are present.

Any known liquid deposition technique can be used, including continuous and discontinuous techniques. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

In some embodiments, the buffer layer, the hole transport layer and the photoactive layer are formed by liquid deposition techniques. The electron transport layer, the electron injection layer and the cathode are formed by vapor deposition techniques.

Detailed Description of FIG. 1

One embodiment of an organic electronic device structure is shown in FIG. 1. The device 100 has a first electrical contact layer, an anode layer 110 and a second electrical contact layer, a cathode layer 160, and a photoactive layer 140 between them. A portion of the anode layer 110 is oxidized to form an oxidized layer 105. Additional layers may optionally be present. Adjacent to the oxidized layer 105 may be a buffer layer 120. Adjacent to the buffer layer 120 may be a hole transport layer 130, comprising hole transport material. Adjacent to the cathode layer 160 may be an electron transport layer 150, comprising an electron transport material. As an option, devices may use one or more additional hole injection or hole transport layers (not shown) next to the oxidized layer 105 and/or one or more additional electron injection or electron transport layers (not shown) next to the cathode 160.

Layers 120 through 150 are individually and collectively referred to as the active layers.

EXAMPLES

The concepts described herein will be further described in the following examples, which do not limit the scope of the invention described in the claims.

Example 1

Example 1 demonstrates the formation of an anode having an oxidized surface layer.

Using the March PX500 system, 300 W of power was applied to a surface of ITO which was 10 inch×18 inch in dimension, giving 0.25 W/cm$^2$ for 10 minutes. The gas pressure used was ~200 mTorr with gases of argon and oxygen. The ratio of Ar to O$_2$ used was 7.5:2.5. The role of Argon is to enhance the Penning dissociation of oxygen.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A process for forming an organic electronic device, comprising:
    providing a TFT substrate having an inorganic surface layer;
    forming a patterned anode on the TFT surface;
    treating the anode with an oxygen plasma with a sufficient power density and for a sufficient time to form a non-conductive, hole-transport surface layer on the anode;
    forming at least one organic active layer on the non-conductive, hole-transport surface layer by a liquid deposition technique;
    applying a cathode to the at least one organic active layer.

2. The process of claim 1, wherein the plasma consists essentially of argon and oxygen with a volume ratio in the range of 9:1 to 0:10.

3. The process of claim 1, wherein the power density is in the range of 0.25 to 1.0 W/cm$^2$, and the treating time is at least 10 minutes.

4. The process of claim 1, wherein the power density is greater than 10 W/cm$^2$.

* * * * *